United States Patent [19]
Heiss et al.

[11] Patent Number: 5,621,404
[45] Date of Patent: Apr. 15, 1997

[54] DIGITAL-TO-DIGITAL SAMPLE RATE CONVERTER

[75] Inventors: Rainer Heiss, Roedermark; Markus Schu, Buettelborn, both of Germany

[73] Assignee: Matsushita Electric Industrial Co., Ltd., Osaka, Japan

[21] Appl. No.: 362,912

[22] Filed: Dec. 23, 1994

[30] Foreign Application Priority Data

Jul. 25, 1994 [EP] European Pat. Off. ............ 94111557

[51] Int. Cl.⁶ .................................................. H03M 7/00
[52] U.S. Cl. .................................... 341/61; 364/724.1
[58] Field of Search ............................. 341/50, 61

[56] References Cited

U.S. PATENT DOCUMENTS

| | | | |
|---|---|---|---|
| 4,496,974 | 1/1985 | Heitmann | 358/140 |
| 4,604,720 | 8/1986 | Stikvoort | 364/724 |
| 5,111,417 | 5/1992 | Belloc et al. | 364/724.1 |
| 5,389,923 | 2/1995 | Iwata et al. | 341/61 |
| 5,485,152 | 1/1996 | Wilson et al. | 341/143 |

*Primary Examiner*—Marc S. Hoff
*Attorney, Agent, or Firm*—Wenderoth, Lind & Ponack

[57] ABSTRACT

A digital-to-digital sample rate converter for converting digital input signals x(n) having a first sample rate F into digital output signals y(m) having a second sample rate F·L/M, wherein L/M is an arbitrary rational fraction. The digital lowpass filter needed for sample rate conversion has a piecewise continuous linear hull curve. This allows an efficient and low-cost hardware solution, since only one multiplier is needed for the digital-to-digital sample rate converter.

23 Claims, 11 Drawing Sheets

| m | $\left[\dfrac{3m}{4}\right]$ | $3m \oplus 4$ |
|---|---|---|
| 0 | 0 | 0 |
| 1 | 0 | 3 |
| 2 | 1 | 2 |
| 3 | 2 | 1 |
| 4 | 3 | 0 |
| 5 | 3 | 3 |
| 6 | 4 | 2 |
| 7 | 5 | 1 |
| 8 | 6 | 0 |
| 9 | 6 | 3 |
| 10 | 7 | 2 |

*FIG. 2A*

| m | OUTPUT OF ADDING MEANS OF THE CONTROL UNIT | OUTPUT OF 6 LSB EXTRACTOR | OUTPT OF 6 BIT RIGHTSHIFT | OUTPUT OF ADDING MEANS OF ADDRESS GENERATOR |
|---|---|---|---|---|
| 0 | 0 = 00000000 | 0 = 000000 | 00 | 0 |
| 1 | 80 = 01010000 | 16 = 010000 | 01 | 1 |
| 2 | 96 = 01100000 | 32 = 100000 | 01 | 2 |
| 3 | 112 = 01110000 | 48 = 110000 | 01 | 3 |
| 4 | 128 = 10000000 | 0 = 000000 | 10 | 5 |
| 5 | 80 = 01010000 | | 01 | 6 |
| ... | ... | ... | ... | ... |

DIGITAL-TO-DIGITAL SAMPLE RATE CONVERTER

BACKGROUND OF THE INVENTION

The present invention relates to a digital-to-digital sample rate converter for converting digital input signals having a first sample rate into digital output signals having a second sample rate.

In TV receivers, analog signal processing has been increasingly replaced by digital signal processing. Digital signal processing offers a wide range of possibilities for the improvement of picture quality, such as noise reduction, flicker reduction, interlacing and skew elimination. Furthermore, digital signal processing advantageously allows one to introduce special features, like, for instance, picture format conversion, panning of pictures, zooming or various cinema effects.

When digital picture signals are processed, for instance when a picture format conversion is to be performed, it may be necessary to convert an original sample rate of the digital signals into a sample rate different from the original sample rate.

In prior art TV receivers, the sample rate conversion is accomplished by converting the original digital signal, having the original sample rate F, into an analog signal and then converting this analog signal back into a new digital signal, having a sample rate F' different from the sample rate of the original digital signal.

A disadvantage of this prior art sample rate conversion is that the hardware to implement the sample rate conversion is complex, since the digital signal needs to be converted from digital to analog and back to digital.

Also, since this prior art sample rate conversion includes analog circuitry, the prior art sample rate conversion is subject to the well known disadvantages of analog components such as tolerances, drift and ageing.

In order to avoid the above mentioned problems related to analog circuitry, it seems advantageous to perform a digital-to-digital sample rate conversion instead of the prior art digital-to-analog-to-digital conversion method. From the theory of digital signal processing, the basic principles of digital-to-digital sample rate conversion are well known. The book "Multirate Digital Signal Processing", by Ronald E. Crochiere, Lawrence R. Rabiner, Prentice Hall, gives an overview of the theoretical background.

However, a direct hardware implementation of the structures for sample rate conversion suggested in the literature is rather inefficient. Such hardware for sample rate conversion requires a large number of multipliers as well as a large filter bank for the filter coefficient for the digital-to-digital sample rate conversion. This consequently means that a chip for digital-to-digital sample rate conversion, using the basic principles suggested in the literature, would have a large amount of gates. This causes not only technical problems, such as timing problems, but also increases the costs for the chip.

SUMMARY OF THE INVENTION

It is therefore an object of the present invention to provide a digital-to-digital sample rate converter having a low complexity.

By using a digital lowpass filter having a piecewise continuous linear hull curve, the digital-to-digital sample rate converter requires only a single multiplier. This greater reduces hardware complexity and allows a cost efficient production of a digital-to-digital sample rate converter. Since the sample rate converter may be used in consumer electronic products, such as digital TV receivers, low cost production is a major advantage.

Since the impulse response of an ideal lowpass filter a (sin x)/x curve, the piecewise continuous linear hull curve of the digital lowpass filter is an approximation of a (sin x)/x curve, with $x=\Pi \cdot F^* \cdot t$, wherein $F^*$ is preferably a sample rate and t is time, such that the piecewise continuous linear hull curve consists of two intersecting straight lines for each segment of the hull curve with x between $\Pi \cdot i < x < \Pi \cdot (i+1)$ and index i being integer.

Furthermore, it is preferable to have a piecewise continuous linear hull curve, which is an approximation of the (sin x)/x curve, wherein the filter length Q equals four. This has the advantage that a good performance for the sample rate converter is achieved with a low hardware complexity.

A preferred embodiment of the sample rate converter uses a piecewise continuous linear hull curve that is symmetrical in the range of $-\Pi < x < \Pi$ and in the ranges of $\Pi \cdot i < x < \Pi \cdot (i+1)$ for integer values $i \leq -2$ and $i \geq 1$, wherein a symmetry exists with respect to $x=0$ and $x=\pm \Pi(3/2+i)$ for $i=0, 1, 2, 3 \ldots$. Symmetry of the piecewise continuous linear hull curve advantageously simplifies the calculation of the sample rate converted output values.

In a preferred embodiment of the present invention, the sum of the filter coefficients of the partial filters equals 1. This has the advantage that the dynamic range of a signal and consequently the energy of the signal is not changed.

Calculation of sample rate converted output values can be even more simplified by selecting the intersection of the two straight lines in the segment $0 < x < \Pi$ to have a value of $a=\frac{5}{8}$ at $x=\Pi/2$ and by selecting the intersection of the two straight lines in the segment $\Pi < x < 2\Pi$ to have a value of minus $\frac{1}{8}$ at $x=3\Pi/2$, since a division by 8 is easily accomplished in a digital filter.

Preferably the piecewise continuous linear hull curve has a value of 1 at $x=0$ and has values of zero at $x=\pm \Pi \cdot i$ for $i=1, 2, 3 \ldots$. This yields a good approximation of the (sin x)/x curve.

A preferred embodiment of the present invention comprises a control unit including an LSB extractor for providing a filter coefficient number (k-number) and an address generator for generating an address signal, which selects the digital input signals for processing by the digital filter. The control unit further comprises rightshift means for providing MSBs. By using an LSB extractor and rightshift means, the hardware for providing the filter coefficient number (k-number) and the address signal is simple and inexpensive.

By providing a lowpass filter for lowpass-filtering the digital input signal prior to sample rate conversion, adverse aliasing effects can be eliminated.

An advantageous embodiment of the present invention provides a preload value to the control unit, such that the filter coefficient number (k-number) is shifted and thus, the digital output value is phase shifted. Non-orthogonal digital pictures having picture lines with differing start phases can be transformed into orthogonal pictures. As a consequence undesired artifacts like, for instance, skewed vertical lines can be avoided.

A preferred embodiment of the present invention comprises a means for supplying a constant decimation factor M. By choosing a fixed decimation factor, the sample rate converter can be used as a picture format converter.

Other preferred embodiments of the present invention comprise a means for supplying a time varying decimation factor M. In a simple case, the time variation varies the decimation factor M in a line by line mode. Thus, digital pictures with various spatial effects (cinema effects) can be generated.

Preferred embodiments of the present invention are described in detail with reference to the drawings.

BRIEF DESCRIPTION OF THE DRAWINGS

FIG. 2A is a table of the time relationship between the output y(m) and the input x(n) for the case M=3 and L=4.

FIG. 2B is an explanatory table for clarifying the operation of the control unit and the address generator of FIG. 3 with L=64 and M=80.

DESCRIPTION OF THE PREFERRED EMBODIMENTS

Figure 1:
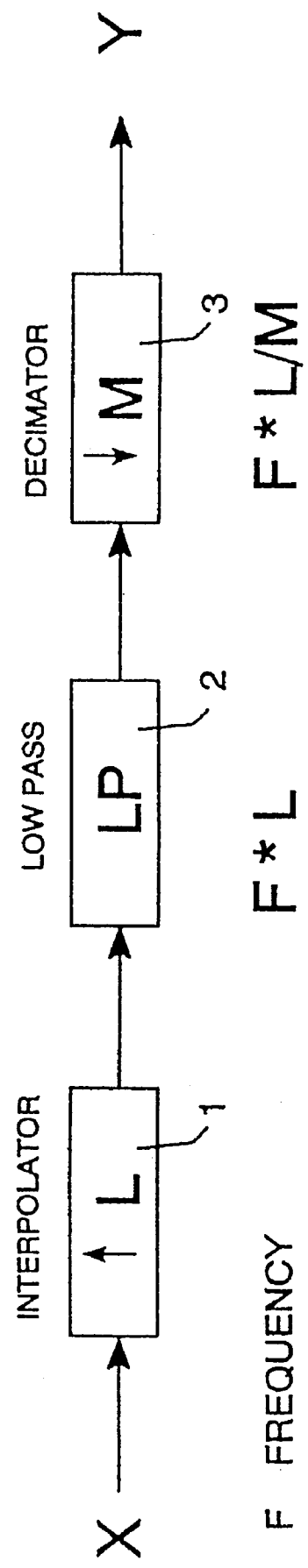
FIG. 1 is an illustrative block diagram of a system for converting the sample rate by a factor of L/M.

FIG. 1 is an illustrative block diagram for explaining the principle of sample rate conversion. It should be noted however, that the block diagram of FIG. 1 is not suited for an efficient hardware solution. An incoming digital signal x having a sample rate F, is input into the interpolator 1. The interpolator 1 increases the sample rate by a factor L. This may be done by adding L−1 zeros between adjacent samples. The operation of adding zeros is called interpolation and L is called the interpolation factor. The interpolated digital signal, having a sample rate of F·L, is input into a lowpass filter 2. The lowpass filter 2 must fulfill the Nyquist criterion in order to eliminate aliasing distortions. The interpolated and lowpass filtered signal is then input into the decimator 3. The sample rate is reduced from F·L to F·L/M by leaving out M−1 sample values and saving only every M-th sample value. The operation of using only every M-th sample value is called decimation and M is called the decimation factor. The output signal y has a sample rate of F·L/M. Equation 1.0 is a mathematical description of FIG. 1.

$$y(m) = \sum_{n=-\infty}^{\infty} h(nL + mM \oplus L) x\left( \left\lfloor \frac{mM}{L} \right\rfloor - n \right) \quad (1.0)$$

$\oplus$:=modulo operator
$\lfloor \ldots \rfloor$: =floor function

The output sample y(m) can be expressed in terms of the input samples x(n) and the filter coefficients h(m). Equation 1.0 represents a linear, periodically time-varying system and connects the output of the sample rate converter directly to the input. For computing the output sample values y(m) it is therefore sufficient to have periodically repeating filters (polyphase filters). From the above follows, that hardware may be developed, which loads the necessary filter coefficients from a filter bank and processes input values in order to compute an output value.

For further discussion of equation 1.0 it is convenient to assume that the length N of the lowpass filter is a multiple of L, that is N=Q·L, wherein Q is an integer value. Then all coefficient sets $h_{mM \oplus L}(n) = h(nL + mM \oplus L)$, m=0 . . . L−1, contain exactly Q coefficients. Furthermore h(nL+mM⊕L) is periodic in m with period L, that is $$h(nL + mM \oplus L) = h(nL + (m + r \cdot L) m \oplus L), r = 0, \pm 1, \pm 2, \ldots$$

Then, equation 1.0 can be expressed as $$y(m) = \sum_{n=0}^{Q-1} h_{mM \oplus L}(n) x\left( \left\lfloor \frac{mM}{L} \right\rfloor - n \right) \quad (2.0)$$

$$= \sum_{n=0}^{Q-1} h(nL + mM \oplus L) x\left( \left\lfloor \frac{mM}{L} \right\rfloor - n \right)$$

Without loss of generality let Q be a constant (for example Q=4) and let L be a constant power of two for all further explanations. Then equation 2.0 is reduced to equation 2.1. Equation 2.1 shows that the computation of an output sample y(m) is obtained as a weighted sum of four sequential samples of x(n) starting at the x(⌊mM/L⌋) sample and going backwards in n sequentially. The weighting coefficients are periodically time-varying so that mM⊕L coefficient set is used for the m-th output sample.

$Q = N/L = 4$ $$y(m) = h(0 \cdot L + mM \oplus L) x\left( \left\lfloor \frac{mM}{L} \right\rfloor - 0 \right) + \quad (2.1)$$

$$= h(1 \cdot L + mM \oplus L) x\left( \left\lfloor \frac{mM}{L} \right\rfloor - 1 \right) +$$

$$= h(2 \cdot L + mM \oplus L) x\left( \left\lfloor \frac{mM}{L} \right\rfloor - 2 \right) +$$

$$= h(3 \cdot L + mM \oplus L) x\left( \left\lfloor \frac{mM}{L} \right\rfloor - 3 \right) +$$

FIG. 2A illustrates this timing relationship for the n=0 term in equation 2.1 for the case M=3 and L=4. The table shows the index value of y(m), ⌊mM/L⌋ and mM⊕L for m=0 . . . 10. The values in column 2 of FIG. 2A are the values of x(3m/4) rounded off to the next integer value. Column 3 of FIG. 2A indicates the periodical variation in time of the filter coefficient number k.

Figure 3:
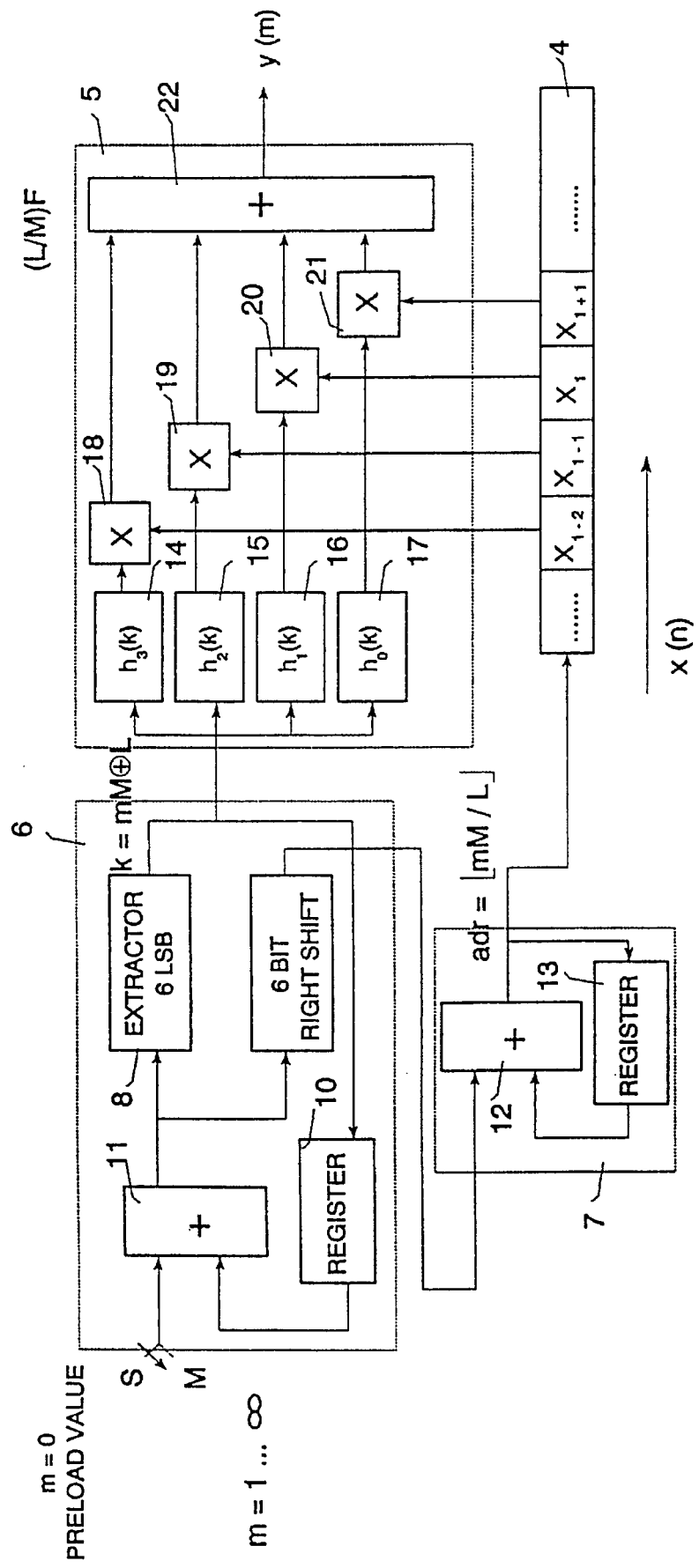
FIG. 3 is a structure for realizing a sample rate converter for conversion by a rational fraction.

The above equation 2.1 for sample rate conversion may advantageously be realized in a structure as shown in FIG. 3. The embodiment of FIG. 3 comprises a Dual Port RAM 4, a FIR filter structure 5, a control unit 6 and an address generator 7. The Dual Port RAM receives the input sample values x(n) as well as address data. The address data adr=⌊mM/L⌋, provided by the address generator 7 determine the order in which the input sample values x(n) are supplied to the FIR filter structure 5.

The control unit 6 comprises extractor means 8 for extracting the 6 LSBs, rightshift 9 for performing a 6 BIT rightshiftor, a register 10 for storing and time delaying the output of the extractor 8 and an adder means 11 for adding an input value of m to the time delayed output of the extractor means.

The address generator 7 comprises adding means 12 for adding the rightshifted signal to the time-delayed address signal adr and a register 13 for storing and time-delaying the address signal adr. The FIR filter 5 comprises means 14, 15, 16, 17 for supplying filter coefficients $h_o(k)$, $h_1(k)$, $h_2(k)$, $h_3(k)$, multipliers 18, 19, 20, 21 for multiplying the input sample values x(n) with the filter coefficients $h_0(k)$, $h_1(k)$, $h_2(k)$, $h_3(k)$ and an adder means 22 for adding the multiplied input sample values.

The structure of FIG. 3 works as follows. The adder means 11 of the control unit 6 is supplied with a preload value S. For S=0 the timing relationship between the output signal y(m) and the input signal x(n) is illustrated in FIG. 2. With a preload value of S≠0 it is possible to start computation with a different filter coefficient number k.

Since in the present example of FIG. 3, an interpolation value of $L=64=2^6$ is used, the extractor 8 extracts the six LSBs from the eight BIT output of the adder 11. It is to be noted, that $L=64=2^6$ is only exemplary. The hardware of the present invention can be realized for any $L=2^l$ with l=0, 1, 2, 3 .... By feeding back the output of the extractor 8 to the register 10, the k-number (k=mM⊕L) may be produced at the output of the extractor 8. The output of the adder 11 is also rightshifted by six BITs. This corresponds to a division $L=64=2^6$. The six BIT rightshifted signal is input into the adder 12 of the address generator 7 and is added to the time-delayed output of the adder 12. The output of the adder 12 thus delivers the address signal adr=⌊mM/L⌋. FIG. 2B clarifies the above described correlation for the values of L=64 and M=80. The first column of FIG. 2B denotes the index number m of the output signal y(m). The second column shows the output of the adder means 11 for increasing values of m. The third column lists the output values k=mM⊕L of the six LSB extractor 8. The fourth column of FIG. 2B indicates the six BIT rightshifted signal output by the rightshiftor means 9. The output adr of the adder 12 is listed in the fifth column of FIG. 2B.

The filter coefficient number k=mM⊕L is input into the FIR filter. By means of the address signal adr, the proper input samples x(n) are read out of the Dual Port RAM. Thus the input samples x(n) can be multiplied by the filter coefficients h(k) in accordance with equation 2.1. The output sample y(m) is obtained by adding the multiplication results.

Figure 6:
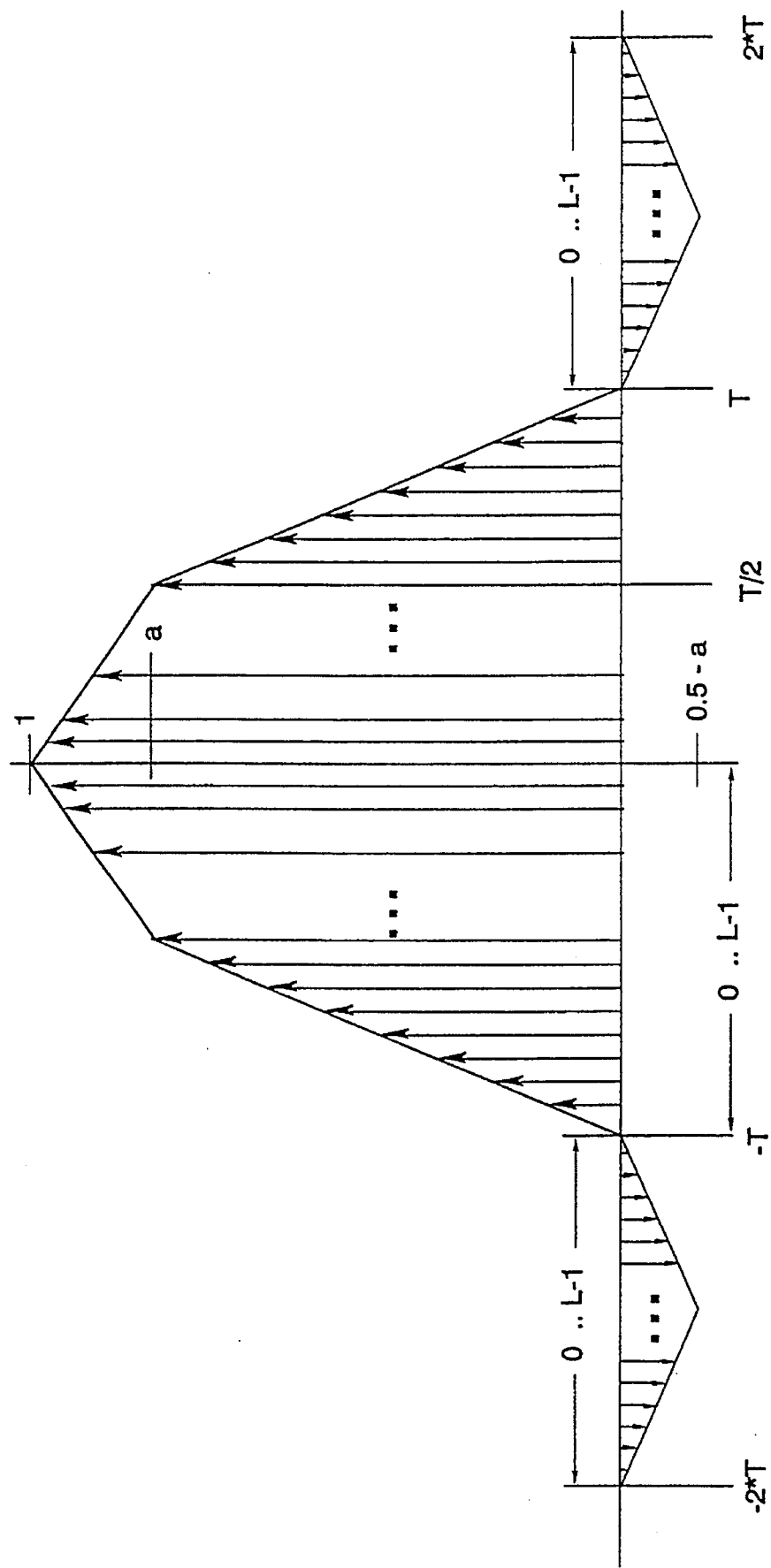
FIG. 6 is a filter curve of a digital lowpass filter according to the present invention.

In order to reduce hardware complexity, it is desirable to have as few as possible multipliers in the FIR filter of FIG. 3. The order of the filter curve of the FIR filter corresponds directly to the number of multipliers needed for the FIR filter. Thus, preferably the filter hull curve of the FIR filter is a linear curve, which means that only one multiplier is needed. Since the FIR filter must have a lowpass characteristic, it is suggested to approximate a curve, preferably a (sin x)/x curve, by a piecewise continuous linear curve. Of course any other piecewise continuous linear curve, that exhibits lowpass characteristics may be used. FIG. 6 shows such a piecewise continuous linear curve that serves as a hull curve for the lowpass filter. T denotes the sampling period with T=1/F, F being the sampling frequency. In this example, each of the sample periods T comprises L=64 arrows indicating 64 discrete functions.

According to theoretical principles, optimum results would be obtained by using a filter curve according to a function (sin x)/x, however, this function is infinite in time and non-linear. Therefore an approximation is made by a piecewise continuous linear function and a reduction in length x. Both approximations cause unavoidable errors. Therefore, it is necessary to consider
a) which parameters are variable, and
b) how can these variable parameters be adapted in order to obtain a compromise between low hardware costs and a good filter performance.

The above mentioned considerations are explained with reference to FIG. 4. The filter coefficients h(k) in FIG. 4 have a piecewise continuous linear hull curve, which approximates the (sin x)/x function in the range from −3<k<+3 (−3T<t<3T). The intersections of the linear hull curves within the segments ±I, ±II and ±III and the values of the linear hull curves at the borders of the segments ±I, ±II and ±III are variable. In other words the parameters, that define the linear hull curves for $h_{2-}$, $h_{1-}$, $h_{0-}$, $h_{0+}$, $h_{1+}$, and $h_{2+}$ need to be chosen appropriately in order to approximate the (sin x)/x curve. Furthermore additional corresponding segments ±IV, ±V . . . may be added to increase filter length. By dropping segments ±III in FIG. 4 and keeping only segments ±I and ±II, the filter length may be reduced. A reduction of the filter length to contain only segments ±I results in rather crude approximations and a low performance of the digital filter.

Figure 4:
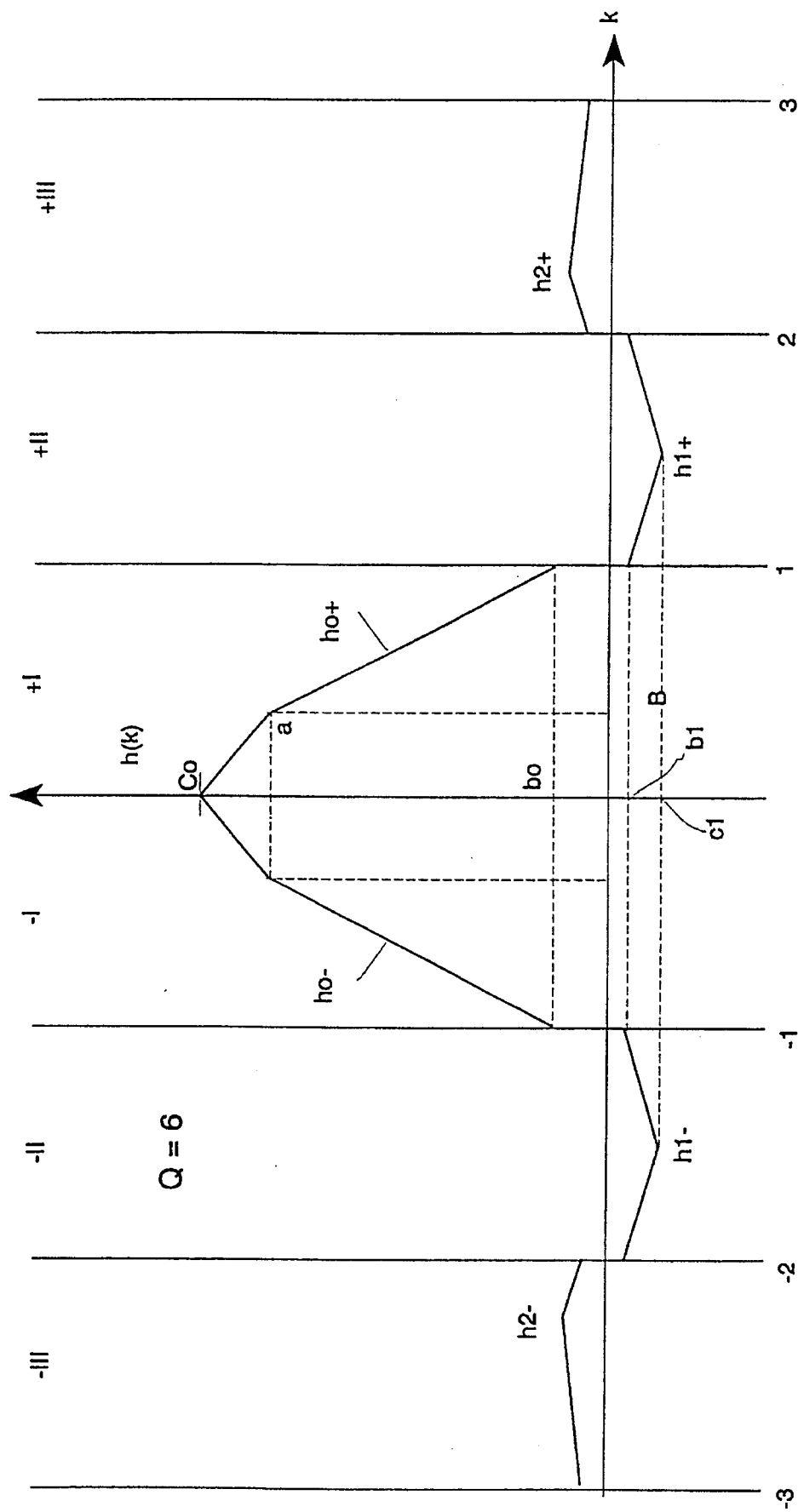
FIG. 4 represents a general filter curve of a digital lowpass filter.

The following formulas represent the respective linear hull curves of the function in FIG. 4. (The equations are made with the assumption, that the coordinate system is shifted such that the origin is located in the leftmost point of each segment).

$$h_{0+}(k) = \begin{cases} c_o + \dfrac{a - c_o}{B} \cdot k & \text{for } 0 \leq k \leq B \\ \dfrac{b_o - a}{1 - B} \cdot k + \dfrac{a - B \cdot b_o}{1 - B} & \text{for } B \leq k \leq 1 \end{cases}$$

$$h_{0-}(k) = \begin{cases} \dfrac{a - b_o}{1 - B} \cdot k + b_o & \text{for } 0 \leq k \leq 1 - B \\ \dfrac{c_o - a}{B} \cdot k + \dfrac{(B - 1) \cdot c_o + a}{B} & \text{for } 1 - B \leq k \leq 1 \end{cases}$$

$l \geq 1$ $$h_{l+}(k) = \begin{cases} \dfrac{c_l - b_l}{B} \cdot k + b_l & \text{for } 0 \leq k \leq B \\ \dfrac{c_l - b_l}{B - 1} \cdot k + \dfrac{b_l \cdot B - c_l}{B - 1} & \text{for } B \leq k \leq 1 \end{cases}$$

$$h_{l-}(k) = \begin{cases} \dfrac{c_l - b_l}{1 - B} \cdot k + b_l & \text{for } 0 \leq k \leq 1 - B \\ \dfrac{b_l - c_l}{B} \cdot k + \dfrac{B \cdot b_l - b_l + c_l}{B} & \text{for } 1 - B \leq k \leq 1 \end{cases}$$

Using the above equations it is possible to determine the parameters B, $c_o$, a, $b_o$ as well as the parameters $c_l$, $b_l$ for $l \geq 1$, such that the desired filter performance is achieved. Since the present filter is a digital filter, the following is to be considered:

N=Q·L with

Q := integer value

N := length of filter

L := interpolation factor

From this follows the above equation 2.0, wherein the h are the filter coefficients of the digital filter, being approximated by linear curve pieces.

Each linear curve piece contains L sample values (correspondingly L coefficients) and there are Q linear curve pieces (e.g. Q=6 in FIG. 4, namely the linear hull curves for segments ±I, ±II, and ±III). For computation of the output value y(m) one coefficient is necessary from each linear curve piece. Therefore, the filter can be imagined as a filter that is composed of L partial filters, wherein each partial filter comprises Q coefficients, which result from Q different segments.

From theoretical considerations it is known, that a filter does only then not change the dynamic range of a signal and consequently does not change the energy of a signal, when the filter coefficients meet the requirement that the sum of the filter coefficients equals 1.

Figure 5:
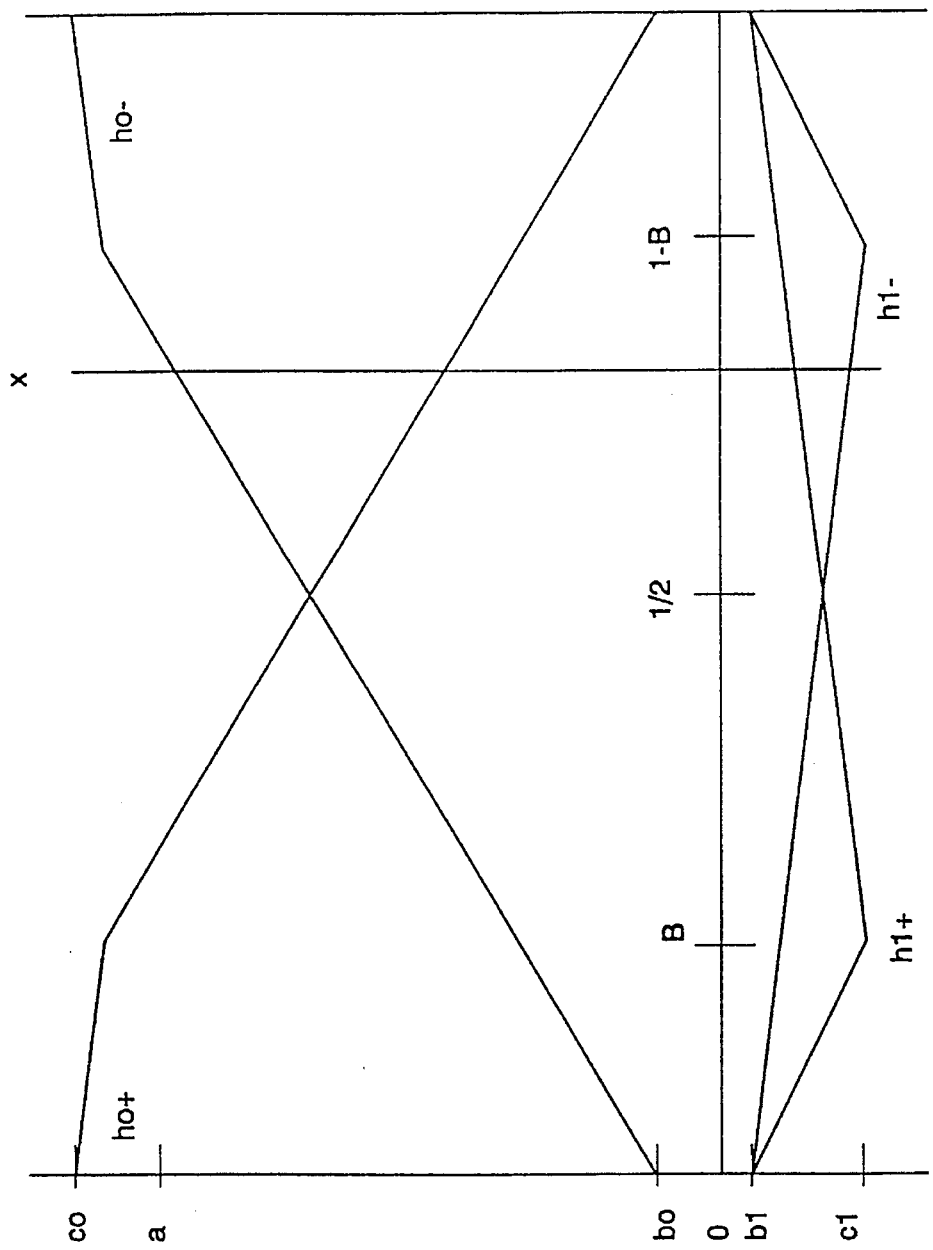
FIG. 5 shows general filter curves drawn in one coordinate system.

The above requirements results in specific adaptions of the partial filters. This will be explained with reference to FIG. 5. All linear curve pieces are drawn in one coordinate system. FIG. 5 shows the linear curve pieces $h_{0-}$, $h_{o+}$, $h_{1-}$ and $h_{1+}$. The linear curve pieces $h_{2+}$ and $h_{2-}$ are not shown, but of course the linear curve pieces $h_{2+}$ and $h_{2-}$ of the segments ±III could be included in FIG. 5. The vertical line marked by an "X" collects the four coefficients of a partial filter. From the above equations follow the constraints for optimization of the parameters:

$$c_o + b_o + 2b_1 = 1$$

$$a + c_1 + \frac{a - b_o}{1 - B} \cdot B + b_o + \frac{c_1 - b_1}{1 - B} \cdot B + b_1 = 1$$

For filter lengths including also segments ±III, the constraints need to be extended correspondingly. Theoretical considerations which were confirmed by tests suggest to select a value of a>0.5. Taking into account the above mentioned constraints and criteria for optimization, the values of the parameters have been selected as follows:

$a=⅝$, $B=½$, $c_0=1$, $b_0=b_1=0$ $c_1=0.5-a=-⅛$, $Q=4$

Figure 7:
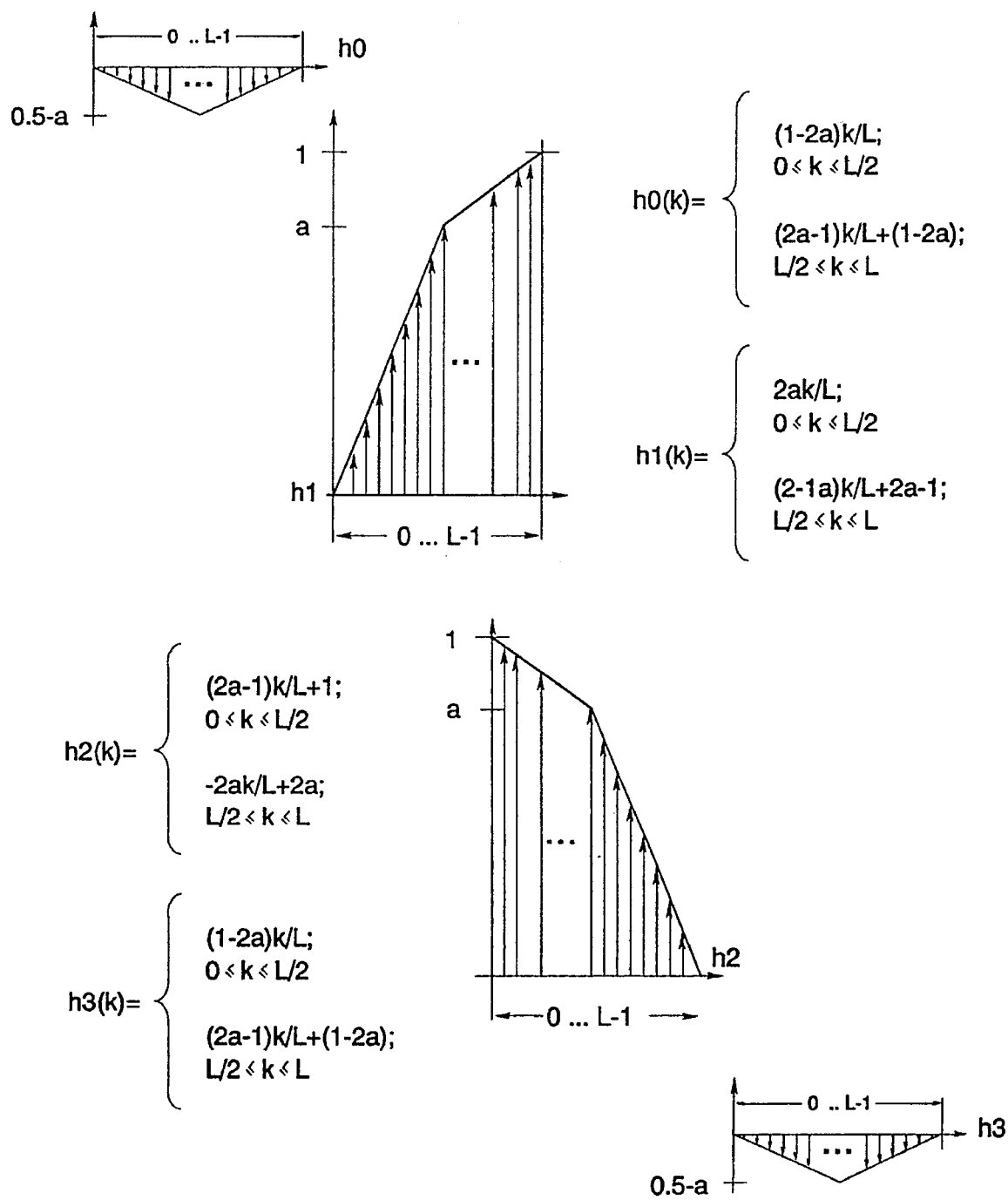
FIG. 7 are separated filter curves of a linear digital lowpass filter according to the present invention.

In principle the hardware may be realized with only one multiplier for all linear curve pieces. It is to be noted, that the above parameters represent a preferred embodiment that requires only a low complexity hardware and even better filter performance may be obtained with a higher filter length (Q>4). In the present application, i.e. sample rate conversion in TV receivers, it turned out that a filter length of Q=4 yields a good benefit for the expenditure needed to implement the hardware. The equations of the four filter curves as shown in FIG. 7, can be stored and the filter coefficients can be calculated during the computation of the output value y(m). Since, as stated above, the hull curve of the filter is piecewise continuous and linear, the hardware may be realized with only one multiplier. Combining the information of FIG. 3 and FIG. 7, it is possible to derive the equations 3.0 to 3.2.

$$y_i = h_0(k) \cdot x_{i+1} + h_1(k) \cdot x_i + h_2(k) \cdot x_{i-1} + h_3(k) \cdot x_{i-2} \quad (3.0)$$

$$0 \leq k \leq \frac{L}{2}$$

$$y_i = [(1 - 2a) \cdot x_{i+1} + 2a \cdot x_i + 2(a - 1) \cdot x_{i-1} + (1 - 2a) \cdot x_{i-2}] \cdot \frac{k}{L} + x_{i-1} \quad (3.1)$$

$$\frac{L}{2} \leq k \leq L$$

$$y_i = [(2a - 1) \cdot x_{i+1} + 2(1 - a) \cdot x_i + (-2a) \cdot x_{i-1} + (2a - 1) \cdot \quad (3.2)$$

$$x_{i-2}] \cdot \frac{k}{L} + [(1 - 2a) \cdot x_{i+1} + (2a - 1) \cdot x_i + 2a \cdot x_{i-1} + (1 - 2a) \cdot x_{i-2}]$$

Equation 3.0 describes a simple FIR filter structure with varying filter coefficients as is for instance shown in FIG. 3. The input values x(n) are first multiplied by the corresponding filter coefficients h(k) and then added to each other. Equation 3.0 is separated into equations 3.1 and 3.2 for values of k between 0 and L/2 and values of k between L/2 and L, respectively. Both equations, 3.1 and 3.2 have a first part, that is dependent of the filter coefficient number k of the required coefficient set and a second part that is independent of the filter coefficient number k. This allows using only one multiplier.

In a preferred embodiment of the present invention, the interpolation factor L and the break point a are chosen to be L=64 and a=⅝. Equations 3.1 and 3.2 can then be transformed into equations 3.3 and 3.4.

$$0 \leq k \leq 32$$

$$y_i = \quad (3.3)$$

$$[(x_i + x_{i-1}) - (x_{i+1} + x_{i-2}) + 4 \cdot (x_i - x_{i-1})] \cdot \frac{k}{64} + 4 \cdot x_{i-1} \Big\} / 4$$

$$32 \leq k \leq 64$$

$$y_i = \{-[(x_i + x_{i-1}) - (x_{i+1} + x_{i-2}) + 4 \cdot (x_i - x_{i-1})] \cdot \quad (3.4)$$

$$\frac{k}{64} + 4 \cdot x_{i-1} + (x_i + x_{i-1}) - (x_{i+1} + x_{i-2}) \Big\} / 4$$

Figure 8:
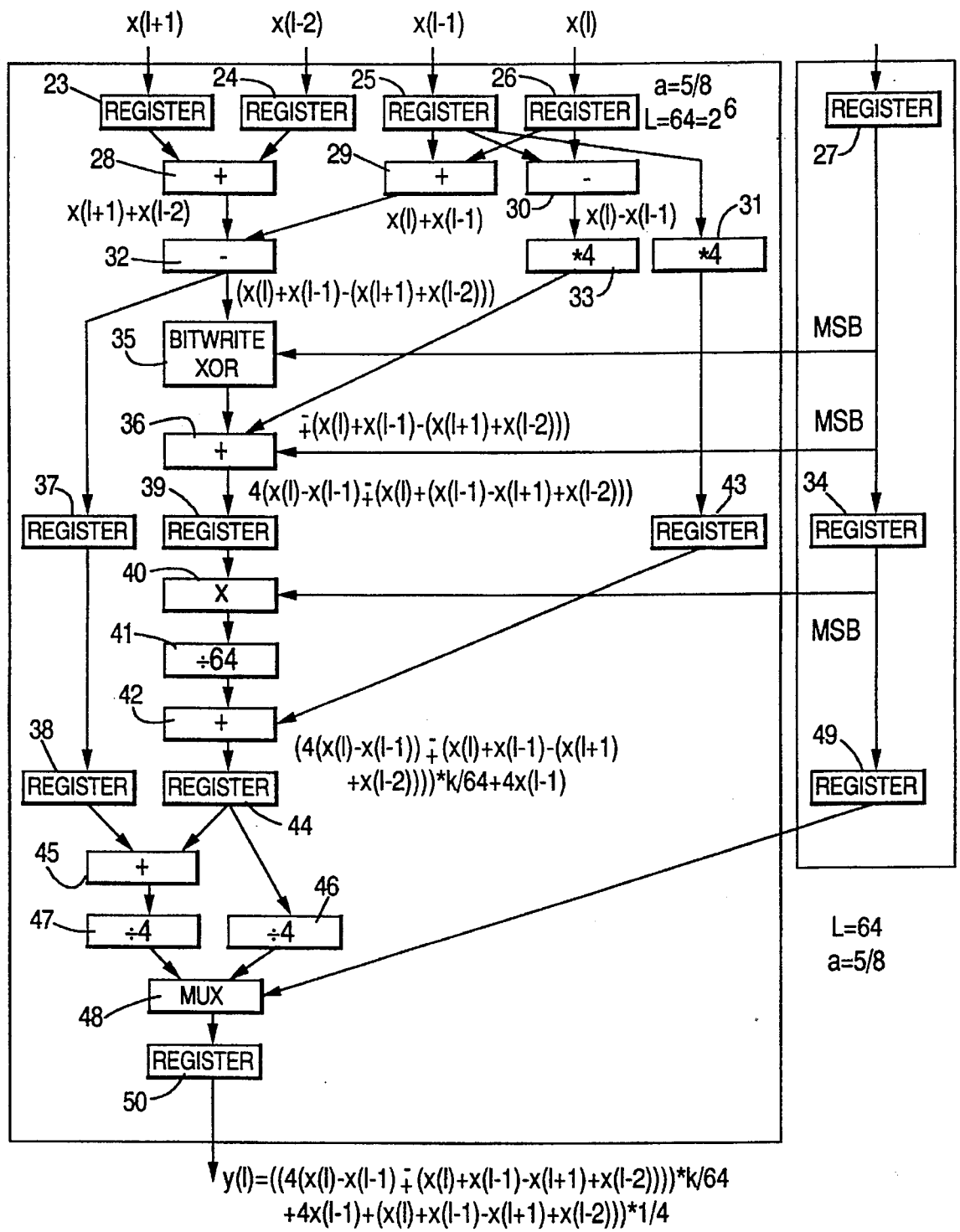
FIG. 8 is a hardware solution for a digital lowpass filter according to the present invention.

FIG. 8 exemplifies a low cost hardware solution for equations 3.3 and 3.4 with an interpolation factor of L=64 and the breakpoint in the filter curve of FIG. 6 at ±T/2 being at a=⅝. The digital lowpass filter comprises four registers 23, 24, 25 and 26 to which the input values x(i+1), x(i−2), x(i−1) and x(i) are supplied. Register 27 is supplied with the filter coefficient number k. The output of register 23 and the output of register 24 are connected to the inputs of adder 28. The output of register 25 is connected to the input of adder 29, to the input of subtracter 30 and to the input of the multiply-by-4 multiplier 31. The output of register 26 is connected to the input of adder 29 and to the input of substracter 30. The output of adder 28 and the output of adder 29 are connected to the inputs of subtracter 32. The output of subtracter 30 is connected to the input of the multiply-by-4 multiplier 33. Register 27 is connected to the input of register 34, to an input of the bitwise XOR gate 35 and to adder 36.

The output of subtracter 32 is connected to an input of the bitwise XOR gate 35 and to the input of register 37. The output of register 37 is supplied to register 38. The output of the bitwise XOR gate 35 and the output of the multiply-by-4 multiplier 33 are connected to inputs of adder 36. The output of adder 36 is input into register 39, whose output is connected to an input of multiplier 40. The second input of multiplier 40 is connected to the output of register 34. The divide-by-64 divider 41 receives the output of multiplier 40 and delivers its output to adder 42. The output of the multiply-by-4 multiplier 31 is supplied to register 43, whose output is connected to an input of adder 42. The output of adder 42 is input into register 44, whose output is connected to an input of adder 45 and to the input of the divide-by-4 divider 46. The output of adder 45 is supplied to the input of the divide-by-4 dividers 47. Both divide-by-4 means 47 and 46 are connected with their respective outputs to the inputs of the multiplexer 48. The MSB of register 34 is supplied to register 49, whose output is connected to an input of multiplexer 48. The output of multiplexer 48 is input into register 50, whose output then supplies the output signal y.

The digital lowpass filter of FIG. 8 works as follows. The input values x(i+1), x(i−2), x(i−1), and x(i) as well as the filter coefficient number k are input into the lowpass filter. The input values x are added or subtracted to give the values of x(i+1)+x(i−2), x(i)+x(i−1) and x(i)−x(i−1). By subtracting the above sums in subtracter 32, the value of (x(i)+x(i−1)−(x(i+1)+x(i−2))) is calculated. The mutiply-by-4 multiplier 33 provides the calculation result of 4(x(i)−x(i−1)). The mathematical expression (x(i)+x(i−1)−(x(i+1)+x(i−2))) is needed with a positive sign for equation 3.3 and with a negative sign for equation 3.4. The bitwise XOR gate 35 and adder 36 change the sign of the above expression in accordance with the MSB from register 27. In other words, the MSB determines which part of the filter curve is to be selected. The output of adder 36 then produces the result of $4(x(i)-x(i-1))\overline{+}(x(i)+x(i-1)-(x(i+1)+x(i-2)))$. Multiplier 40 multiplies the output value of register 39 and the filter coefficient number k which is output by register 34. The output of multiplier 40 is divided by 64 in the divide-by-64 means 41, the value of $4x(i-1)$, output by register 43, is added and the result is input into register 44. In order to get the result of equation 3.3, the output of register 44 is divided by 4 in the divide-by-4 divider 46. In order to get the result of equation 3.4, the output of register 44 is added to the output of sustracter 32 via the registers 37 and 38, and is then divided by 4 in the divide-by-4 divider 47. The multiplexer 48 receives the MSB of the filter coefficient number k from register 49. The MSB decides which part of the filter curve is to be selected. Consequently, the MSB decides which output, either the output of the divide-by-4 divides 46 for the result of equation 3.3 or the output of the divide-by-4 divider 47 for the result of equation 3.4 is to be selected. FIG. 8 shows that the selected parameters yield multiplications and divisions by $2^n$, n being integer, which can advantageously be implemented by bit-shifting.

Figure 9:
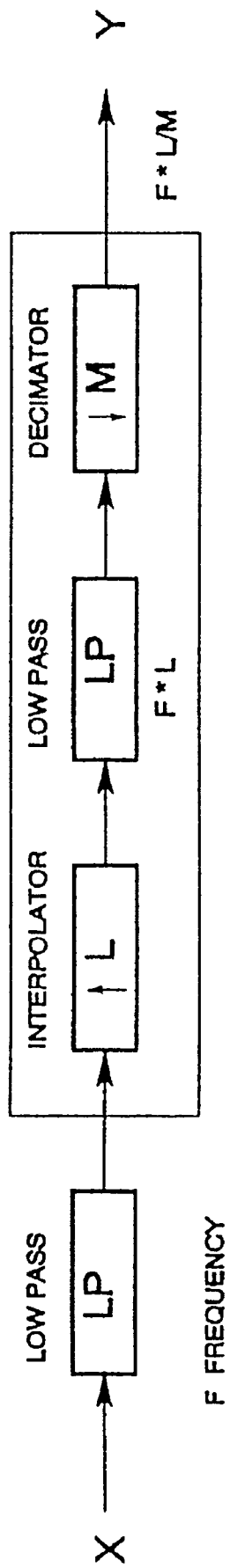
FIG. 9 is a block diagram of an improved sample rate converter concept.

The characteristics of the digital low-pass filter of the present invention is determined by the piecewise linear coefficients. As as result, lowpass characteristics of the digital filter having filter coefficients as shown in FIG. 6 may not be sufficient to fulfill the Nyquist criterion. In order to fulfill the Nyquist criterion, the incoming signal may simply be filtered by a lowpass filter. FIG. 9 shows an improved sample rate converter concept using a lowpass filter 51 for the input signals. The definite cut-off frequency of the lowpass filter must relate to the decimation value M in order to meet the Nyquist criterion. In other words, the incoming signal has to be band limited according to the chosen rational fraction L/M.

The above described digital-to-digital sample rate converter may be advantageously used to eliminate skew problems in TV pictures having picture lines with differing start phases. A digital picture having skewed lines is also called a non-orthogonal picture. When a non-orthogonal picture is displayed on the TV screen, undesirable artifacts like, for instance, skewed vertical lines will appear. The above described digital-to-digital sample rate converter may be modified in order to generate an orthogonal picture, which has matching start phases for all picture lines. A preferred embodiment of the present invention is able to generate an orthogonal picture, if the information of the differing start phases is available. Adder 11 of FIG. 3 is supplied with a preload value S. FIG. 2A illustrates the time relationship between y(m) and x(n) for a preload value of S=0. With a preload value S≠0 it is possible to start computation of an output value using a filter coefficient number k that is different from the filter coeffient number k used with a preload values S=0. A preload value S≠0 consequently means a phase shift for the digital output value y(m). In order to describe this behavior in mathematical terms, equation 2.0 can be amended to yield equation 4.0.

$$y(m) = \sum_{n=0}^{Q-1} h(nL + mM \oplus L + S) x\left( \left\lfloor \frac{mM}{L} \right\rfloor - n \right) \quad (4.0)$$

By selecting preload values S≠0, the start phases of lines are shifted to have start phases that produce an orthogonal picture where skew problems are eliminated.

The adder 11 of the control unit 6 has the decimation value M as a second input. In case the output sample rate $(L_o/M_o)\cdot F$ is fixed and a decimation value $M\neq M_0$ is chosen via the second input of adder 11 the digital-to-digital sample rate converter works as a picture format converter. The embodiments of the digital-to-digital sample rate converter described so far have an arbitrary fixed decimation value M, however, in a preferred embodiment, the decimation value M may be changeable.

Figure 10:
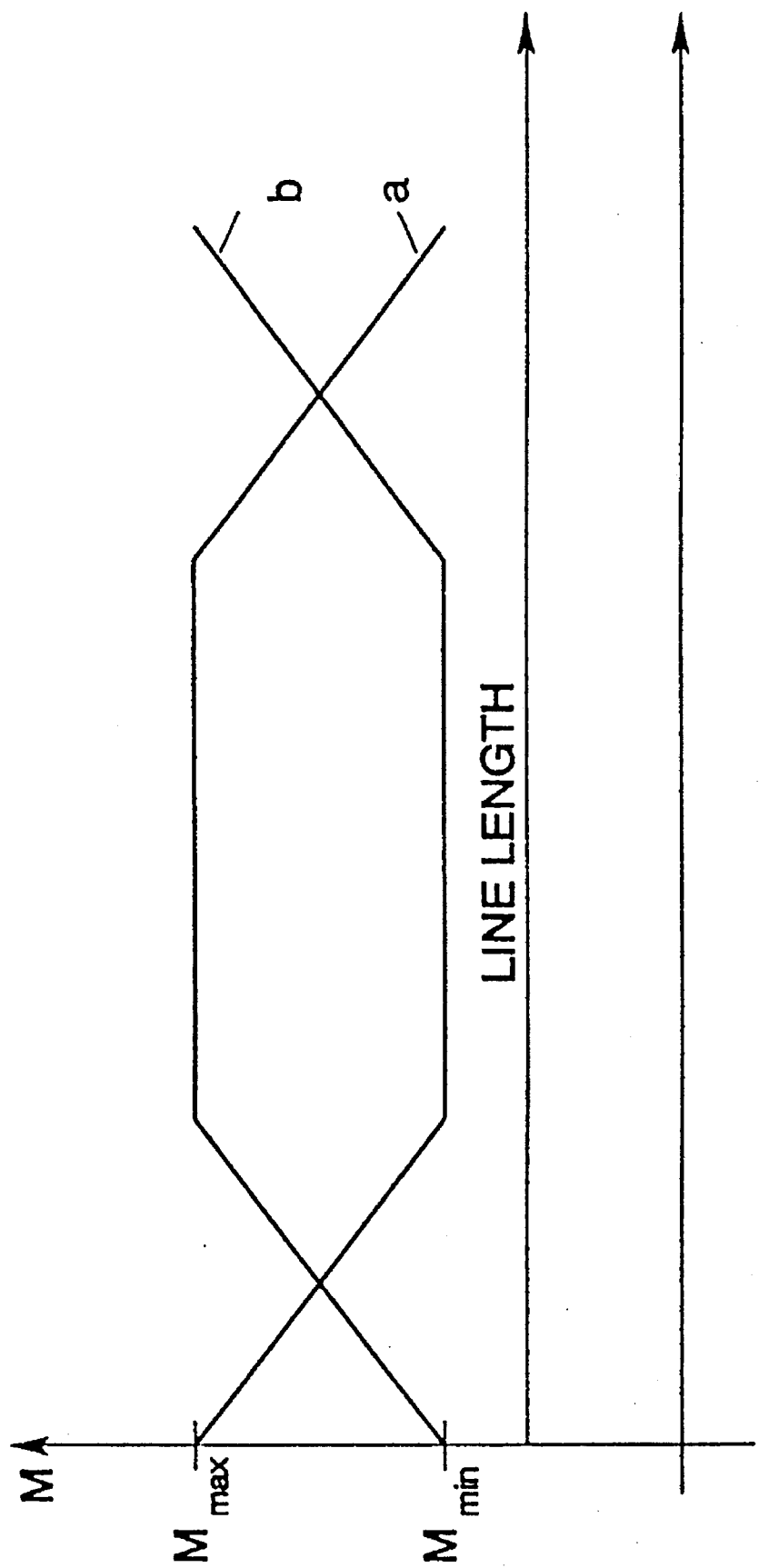
FIG. 10 is a diagram of examples for a time varying decimation factor M.

The decimation value M can be made time-varying. In that case, a digital picture with spatial effects, so called cinema effects, is generated. A simple method to vary the decimation value M for each line of a digital picture is shown in FIG. 10. Along the video line, the decimation value M of curve "a" in FIG. 10 increases from a minimum decimation value of Mmin to a maximum decimation value Mmax. The decimation value M remains constant for a part of the line length and then decreases to the value of Mmin. Curve "b" shows a decimation value M that decreases, remains constant and then increases along the video line. Of course any other method for a variation of M can be utilized to generate various spatial effects. Similar to varying the decimation value M, the interpolation value L may be varied. Further embodiments of the digital-to-digital sample rate converter may use a combination of any of the above features, such as for instance a sample rate converter that can shift the phase for the digital output value y(m) and, at the same time, varies the decimation value M.

What is claimed is:

1. A digital-to-digital sample rate converter for converting digital input signals (x(n)) having a first sample rate (F) into digital output signals (y(m)) having a second sample rate ($F \cdot L/M$ with L and M being integer values), the digital-to-digital sample rate converter comprising:

a digital lowpass filter having a piecewise continuous linear hull curve for processing digital input signal (x(n)) in accordance with a set of filter coefficients (h(k)), wherein the piecewise continuous linear hull curve of the digital lowpass filter is an approximation of a (sin x)/x curve with $x = \Pi \cdot F^* \cdot t$ $F^* :=$ sample rate $t :=$ time wherein the piecewise continuous linear hull curve consists of two intersection straight lines for each segment of the hull curve with x between $\Pi \cdot i < x < \Pi \cdot (i+1)$ and index i having integer values.

2. A digital-to-digital sample rate converter according to claim 1, wherein the integer index i runs from i=−2 to i=1, resulting in a filter length of Q=4 (Q partial filters).

3. A digital-to-digital sample rate converter according to claims 1 or 2, wherein the piecewise continuous linear hull curve is symmetrical with respect to the values of x=0 and $x = \pm \Pi(3/2 + i)$ for i=0, 1, 2, 3 . . . .

4. A digital-to-digital sample rate converter according to one of claim 1, wherein the sum of all filter coefficients (h(k)) of all partial filters equals 1.

5. A digital-to-digital sample rate converter according to one of claims 1 or 2, wherein the intersection of the two straight lines in the segment $0<x<\Pi$ has a value of a=⅝ at $x=\Pi/2$ and the intersection of the two straight lines in the segment $\Pi<x<2\Pi$ has a value of 0.5 minus ⅝ at $x=3\Pi/2$.

6. A digital-to-digital sample rate converter according to one of claims 1 to 2, wherein the piecewise continuous linear hull curve has a value of 1 at x=0 and has values of zero at $x=\pm\Pi\cdot i$ for i=1, 2, 3 . . . .

7. A digital-to-digital sample rate converter according to one of claims 1 to 2, further comprising:

a control unit for providing a filter coefficient number (k), and an address generator for generating an address signal (adr), the address signal selecting digital input signals (x(n)) for processing by the digital lowpass filter.

8. A digital-to-digital sample rate converter according to claim 7, further comprising a memory for storing the digital input signals (x(n)), the input signals being read out in accordance with the address signal (adr).

9. A digital-to-digital sample rate converter according to one of claims 1 or 2, wherein said digital filter is a digital lowpass filter having just one multiplier.

10. A digital-to-digital sample rate converter according to claim 8, wherein sail control unit comprises:

a register for storing the filter coefficient number (k);

an adder for supplying a preload value (S);

an extractor for generating the filter coefficient number (k) by extracting LSBs from the output of the adder in accordance with an interpolation value (L);

a rightshifter for generating MSBs of the output of the adder;

and said address generator comprises:

an adder for generating the address signal (adr) by adding the MSBs, generated by the rightshifter and the address signal (adr) of a previous computation step; a register for supplying the address signal (adr) of the previous computation step to the adder; said memory comprises a Dual Port RAM.

11. A digital-to-digital sample rate converter according to claim 10, further comprising means for supplying a preload value (S) to the adder of the control unit (6) such that the filter coefficient number (k) is shifted to produce a phase shift for the digital output signal (y(m)).

12. A digital-to-digital sample rate converter according to one of claims 2 or 3, further comprising a lowpass filter for lowpass filtering the digital input signal (x(n)) prior to sample rate conversion.

13. A digital-to-digital sample rate converter according to one of claims 1 or 2, further comprising a means for supplying a constant decimation value (M).

14. A digital-to-digital sample rate converter according to one of claims 1 or 2, further comprising a means for supplying a time-varying decimation value (M).

15. A digital-to-digital sample rate converter according to one of claims 1 or 2, further comprising a means for supplying a decimation value (M) varying along a line of a digital picture.

16. A method of digital-to-digital sample rate conversion for converting digital input signals (X(n)) having a first sample rate (F) into digital output signals (y(m)) having a second sample rate (·L/M with L and M being integer values), the method comprising processing the digital input signals (x(n)) with a lowpass filter curve having a piecewise continuous linear hull curve, wherein the digital input signals (x(n)) are processed by a lowpass filter hull curve which is approximated by a (sin x)/x curve with $x = \Pi \cdot F^* \cdot t$ $F^* :=$ sample rate $t :=$ time wherein the piecewise continuous linear hull curve consists of two intersection straight lines for each segment of the hull curve with x between $\Pi \cdot i < x < \Pi \cdot (i+1)$ and index i having integer values.

17. A method of digital-to-digital sample rate conversion according to claim 16, wherein the integer index i runs from i=−2 to i=1.

18. A method of digital-to-digital sample rate conversion according to claim 16 wherein the piecewise continuous linear hull curve is symmetrical with respect to x=0, wherein the intersection of the two straight lines in the segment $0 < x < \Pi$ has a value of a=⅝ at x=Π/2 and the intersection of the two straight lines in the segment $\Pi < x < 2\Pi$ has a value of 0.5 minus ⅝ at x=3Π/2.

19. A method of digital-to-digital sample rate conversion according to claim 16 further comprising:

selecting digital input signals (x(n)) in the vicinity of the digital output signal (y(m)) to be calculated, and providing a filter coefficient number (k) selecting a filter coefficient set corresponding to the piecewise continuous linear hull curve.

20. A method of digital-to-digital sample rate conversion according to claim 16, wherein said processing of the digital input signals (x(n)) includes only one step of multiplication.

21. Method of digital-to-digital sample rate conversion according to claim 16 further comprising lowpass filtering (51) the digital input signals (x(n)) in accordance with the Nyquist criterion prior to sample rate conversion.

22. A method of digital-to-digital sample rate conversion according to claim 16 further comprising the step of shifting (S) the filter coefficient number (k) such that the phase of the digital output signal (y(m)) is shifted.

23. A method of digital-to-digital sample rate conversion according to claim 16 further comprising varying a decimation factor (M) in time to produce digital pictures with spatial effects.

* * * * *